(12) United States Patent
Lau

(10) Patent No.: US 6,455,427 B1
(45) Date of Patent: Sep. 24, 2002

(54) METHOD FOR FORMING VOID-FREE METALLIZATION IN AN INTEGRATED CIRCUIT

(75) Inventor: Gorley L. Lau, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/474,865

(22) Filed: Dec. 30, 1999

(51) Int. Cl.7 .............................................. H01L 21/44
(52) U.S. Cl. ....................... 438/688; 438/622; 438/627; 438/629; 438/625; 438/660; 438/672
(58) Field of Search ................................ 438/688, 687, 438/622, 625, 627, 629, 637, 642, 652, 653, 654, 660, 672; 427/96, 97, 99; 204/192.12, 192.17, 192.15; 29/825, 829, 846, 851, 852

(56) References Cited

U.S. PATENT DOCUMENTS

| | | | |
|---|---|---|---|
| 4,970,176 A | 11/1990 | Tracy et al. ................ 437/187 |
| 5,011,793 A | * 4/1991 | Obinata ...................... 437/203 |
| 5,108,570 A | 4/1992 | Wang ....................... 204/192.3 |
| 5,108,951 A | 4/1992 | Chen et al. ................. 437/187 |
| 5,270,255 A | 12/1993 | Wong ......................... 437/194 |
| 5,288,665 A | 2/1994 | Nulman ..................... 437/194 |
| 5,358,616 A | 10/1994 | Ward ....................... 204/192.8 |
| 5,371,042 A | 12/1994 | Ong .......................... 437/194 |
| 5,378,660 A | 1/1995 | Ngan et al. ................. 437/247 |
| 5,443,995 A | 8/1995 | Nulman ..................... 437/197 |
| 5,658,828 A | * 8/1997 | Lin et al. .................... 438/643 |
| 5,665,659 A | 9/1997 | Lee et al. ................... 438/646 |
| 5,693,564 A | 12/1997 | Yu ............................. 437/192 |
| 5,731,245 A | 3/1998 | Joshi et al. ................. 438/705 |
| 6,093,654 A | * 7/2000 | Koyama .................... 438/715 |

OTHER PUBLICATIONS

Xu et al., "Plar Multilevel Metallization Technologies for ULSI Devices," SPIE vol. 2335, 1994, pp. 70–79.
Xu et al., "A1 planarization processes for multilayer metallization of quarter micrometer devices," Thin Solid Films, vol. 253, 1994, pp. 367–371.
Singer, "The Interconnect Challenge: Filling Small, High Aspect Ratio Contact Holes," Semiconductor International, Aug. 1994, 5 pages.
Robinson, "A1 hits sub–0.25 micron vias," pp. 37 and 42, Electronic Engineering Times, Issue 939, Feb. 1997.
Metal Deposition Products, Applied Materials–Products and Services, 5 pages, printed Nov. 1999, ©1999 Applied Materials, Inc.
"Ionized Physical Vapor Deposition," printed Dec. 1999, www.ece.neu.edu/edsnu/hopwood, 8 pages.

* cited by examiner

Primary Examiner—Tuan H. Nguyen
Assistant Examiner—T. Pham
(74) Attorney, Agent, or Firm—Kevin L. Daffer; Conley, Rose & Tayon P.C.

(57) ABSTRACT

A metallization structure and method for fabricating such a metallization structure are presented. The present method preferably includes forming a void within a metal layer. The void may have a void pressure level, which is preferably approximately equal to the pressure in a deposition chamber in which the metal layer is arranged when the void is formed. Subsequently, the void may be collapsed by increasing a pressure level outside of the void to a collapsing pressure level significantly above the void pressure level. Increasing a pressure level outside of the void preferably includes increasing a pressure level within the deposition chamber to a collapsing pressure sufficient to collapse the void. A metallization structure formed by such a process may be substantially void-free, even in narrow, high aspect ratio metallization cavities.

20 Claims, 8 Drawing Sheets

METHOD FOR FORMING VOID-FREE METALLIZATION IN AN INTEGRATED CIRCUIT

BACKGROUND OF THE INVENTION

1. Field of the Invention

This invention relates to integrated circuit fabrication and, more particularly, to methods for forming metallization structures.

2. Description of the Related Art

The information described below is not admitted to be prior art by virtue of its inclusion in this Background section.

An integrated circuit includes numerous active and passive devices arranged upon and within a single substrate. In order to implement desired circuit functions, select devices or components of the integrated circuit must be interconnected. Metallization structures are often used to interconnect integrated circuit components. Metallization structures may be generally subdivided into two categories: laterally extending interconnect lines and vertically extending contacts or plugs. Interconnects are relatively thin lines of conductive material that largely extend parallel to the underlying devices. As the name implies, contacts are the metallization structures that actually contact the devices of the integrated circuit. Plugs mostly extend vertically between metallization levels.

Within each level of interconnect, metallization structures are separated from other structures on underlying or overlying levels, and from structures within the same metallization level, by dielectric materials. The dielectric materials prevent unwanted communication between separated metallization structures. In large part because of the difficulty in etching many metallization materials, metallization structures are often formed by first depositing the dielectric material which will separate the metallization structures and then patterning cavities in the dielectric material (i.e., metallization cavities) for the metallization structures. The metallization cavities patterned for interconnect structures are typically called trenches, and the metallization cavities patterned for plugs are typically called vias. Once the cavities are formed, metals can then be deposited in the cavities to form metallization structures. If necessary, the deposited metal can be planarized, a process that often involves chemical-mechanical polishing (CMP).

Despite the name, metallization structures are not required to actually be metals, but may instead be fabricated from any material sufficiently conductive to transmit an electrical signal (e.g., doped polysilicon, metal silicides, refractory metal nitrides). For metallization structures above the level of local interconnect, though, metals are the predominant metallization materials, and one of the most common metallization materials is aluminum. Aluminum is desirable as a metallization material because of, among other things, its relatively low resistance and good current-carrying density.

Aluminum is usually deposited using physical vapor deposition (PVD). PVD processing may also be known as sputter deposition, or sputtering. In general, sputter deposition may be considered to be any deposition process in which a material is deposited by sputtering the material from, e.g., a target composed of the material to be deposited. A typical method for sputtering a metal onto a substrate includes introducing an inert gas into a deposition chamber and forming a plasma that ionizes the inert gas by applying a potential between the substrate and the target. The ionized inert gas atoms are then attracted toward the target, and collide with the target with such force that atoms of the target are sputtered off. The sputtered atoms may then deposit on the substrate.

Sputtering can be used to deposit any variety of materials, including conductors, non-conductors, and high melting point compounds. Sputtering is advantageous because it may provide for good step coverage and accurate transfer of material composition from the target to the deposited metal. This last feature is particularly helpful when depositing alloys.

One process for forming a metallization structure incorporating aluminum involves first sputter depositing a titanium wetting layer into the cavity in which the metallization structure will be contained. The titanium wetting layer lines the sidewalls and base of the cavity. A bulk metal layer of aluminum is then sputter deposited onto the wetting layer to fill the cavity. The titanium wetting layer helps to minimize or avoid agglomeration of the aluminum bulk metal layer and provides for continuous metal coverage along the sidewalls and bottom of the cavity. The aluminum bulk metal layer serves as the primary conductive material of the resulting metallization structure.

Bulk metal layers composed of aluminum are typically deposited by either standard or collimated sputtering processes. Standard sputtering processes may be considered those sputtering processes that do not impart any significant degree of directionality to the sputtered atoms. Standard sputtering processes thus allow sputtered atoms to contact the deposition surface at a variety of angles, ranging from almost parallel through perpendicular. In contrast, collimated sputtering processes typically use a collimator arranged between the target and a deposition surface to block high impact angle atoms (e.g., those atoms having impact angles further from perpendicular) while allowing lower impact angle atoms (e.g., those atoms having impact angles closer to perpendicular) to pass through. Collimated sputtering processes, however, generally do not impart significant directionality to the sputtered atoms that are allowed to pass through the collimator.

Unfortunately, as the widths of metallization cavities continue to decrease and the aspect ratios of such cavities continue to increase, forming an adequate bulk metal layer becomes more difficult. One reason for this difficulty results from the buildup of deposited metal on the upper sidewalls of a metallization cavity. Because the majority of metal atoms deposited in a standard or even a collimated sputtering process will have impact angles deflected from perpendicular, the dielectric layer upper surface adjacent the cavity and on the upper sidewalls of the cavity may receive significantly more deposited metal atoms than the lower sidewalls and bottom of the cavity. This buildup on the dielectric layer upper surface adjacent the cavity and upper sidewalls of the cavity may result in metal overhanging, or shadowing, the lower cavity sidewalls and cavity floor. When this happens, deposited metal cannot reach the shadowed sidewall portions, and thus these areas may not receive sufficient metal coverage. This is particularly a problem for the lower portions of the cavity sidewalls, which are perhaps the portions most likely to be shadowed.

Furthermore, because the overhanging metal prevents deposited metal from reaching the shadowed portions of the cavity, metal may build up on the overhanging areas during deposition so much that the opening near the upper region of the cavity becomes closed. If the cavity was not filled before the opening was closed, a void (commonly known as a "keyhole void" because of its shape) can exist within the cavity. The presence of a void within a final metallization structure, of course, can be extremely detrimental to the performance of the structure.

In an attempt to resolve this problem, many processes have implemented hot sputter depositing of the bulk metal layer. Generally speaking, a metal can be either cold sputter deposited or hot sputter deposited. Cold sputter deposition processes deposit a metal at a temperature such that the deposited metal, upon deposition, cannot significantly reflow, and hot sputter deposition processes deposit a metal at a temperature such the deposited metal, upon deposition, can significantly reflow. Reflow of hot sputter deposited materials may result from solid phase and surface diffusion, possibly driven by capillary forces. Reflow may be aided by the thermal energy imparted by the impact of subsequently depositedatoms. Significant reflow preferably encompasses only those forms of bulk redistribution of a metal that occur at elevated temperatures. One benefit of hot sputter deposition of a bulk metal layer is that small voids formed in a bulk metal layer may be filled by reflow of the bulk metal layer into the void.

Many voids cannot, however, be filled simply by reflow of a hot sputtered bulk metal layer. For example, some voids that may form in very small, very high aspect ratio cavities may be too large to refill using only reflow. In addition, cooling of the bulk metal layer before the bulk metal layer has had a chance to reflow into a void as a result of, e.g., subsequent processing, may also prevent voids void-filling capillary action. But since the filling of a void by metal reflow is a relatively slow process, maintaining a bulk metal layer in a "reflow" condition for a significant period detracts from valuable processing time. Consequently, with the decreasing cavity width and increasing cavity aspect ratio that are ever-present in current integrated circuit fabrication processes, mere reflow of the bulk metal layer into any voids formed in the bulk metal layer is often insufficient to properly fill every void formed during deposition. In other words, bulk metal layer reflow alone often cannot be reliably depended upon as a mechanism for filling voids formed in bulk metal layers arranged in narrow, high aspect ratio cavities.

Therefore, it would be desirable to develop an improved method for fabricating a metallization structure. The desired method should allow for the reliable filling of even extremely small, very high aspect ratio metallization cavities without significant void formation.

SUMMARY

The problems discussed above are in large part resolved by the present metallization structure and a method for fabricating such a structure. The present method preferably includes forming a void within a metal layer. The void is encircled with metal and has an internal pressure (i.e., void pressure level) that is preferably approximately equal to the pressure in a deposition chamber in which the metal layer is arranged when the void is formed. Subsequently, the void may be collapsed by increasing a pressure level outside of the void (i.e., collapsing pressure level) significantly above the void pressure level. Increasing a pressure level outside of the void preferably includes a pressure level within the deposition chamber to a collapsing pressure sufficiently above the void pressure to collapse the void. A metallization structure formed by such a process may be substantially void-free, even in narrow, high aspect ratio metallization cavities.

In an embodiment, a portion of the metal layer is arranged within a cavity defined in a dielectric layer. Forming a void within the metal layer then preferably includes reflowing at least the portion of the metal layer arranged within the cavity at a pressure less than a first metal deposition pressure at which the metal layer was deposited. Such reflowing is preferably continued for a reflowing time sufficient to allow the void to form within the portion of the metal layer arranged within the cavity.

The present method preferably facilitates the reliable filling of narrow, high aspect ratio metallization cavities by taking advantage of the tendency of metals deposited in such cavities to form voids. As noted previously, a void often forms in a metal layer that is sputter deposited into a narrow, high aspect ratio cavity. If the void remains in final metallization structure, the void can prevent the structure from performing as desired. The present method, however, preferably collapses the void by increasing the pressure level within the deposition chamber to a collapsing pressure level. The collapsed metal previously surrounding the void thus collects at the bottom of the unfilled portion of the cavity. As such, the void collapse effectively reduces the aspect ratio of the remaining unfilled portion of the cavity. The remaining unfilled portion ofthe cavity can subsequently be more easily filled, which preferably results in a metallization structure having excellent fill characteristics and that is substantially void-free. Further, because the present method preferably collapses any voids formed in the metal layer, concern about whether any voids actually remain (such as is present when relying on reflow alone to fill a cavity) may be greatly reduced.

The present process also preferably obtains such benefits without requiring the incorporation of overly complicated, multiple-chamber bulk metal layer deposition processes. In response to the difficulty that conventional metallization structure formation processes have with small, high aspect ratio cavities, some manufacturers have resorted to using overly complex methods to deposit the bulk metal layer. Some of these methods require multiple chambers for deposition of the bulk metal layer, which may substantially increase the total cost of the metallization process.

But since the present method is preferably configured to collapse the air/gas-filled voids formed in a bulk metal layer deposited in a cavity, the fact that a single chamber metal deposition process may form a void in narrow, high aspect ratio cavities may actually be used to improve the fill characteristics of that process (once the process is modified to accord with the process presented herein). Consequently, the present method may obtain desired process goals without requiring the acquisition and use of overly complicated bulk metal layer deposition processes and equipment, and without suffering the possible extension in overall processing time and cost that may result from forming a bulk metal layer in more than one deposition chamber. In other words, the present method may be used to significantly extend the life of current deposition equipment.

In a preferred embodiment, the bulk metal layer deposition process may be performed in a bulk metal layer deposition chamber. The bulk metal layer deposition process preferably includes cold sputter depositing a cold sputtered portion of the bulk metal layer. A first hot sputtered portion of a bulk metal layer may subsequently be sputter deposited within a cavity defined in a dielectric layer and above the cold sputtered portion of the bulk metal layer. The bulk metal layer deposition chamber preferably has a first metal deposition pressure level during deposition of the first hot sputtered portion of the bulk metal layer. Subsequently, the pressure level within the bulk metal deposition chamber may be reduced to a reflowing pressure level significantly below the first pressure level. Reducing the pressure preferably encompasses the process(es) of initiating a reduction in deposition chamber pressure, achieving the targeted reduced pressure, and maintaining the reduced pressure for a predefined amount of time. During pressure reduction, the first hot sputtered portion of the bulk metal layer may be reflowed for a reflowing time sufficient to allow a void to form at least partially within the cavity by reflow of at least a portion of the bulk metal layer arranged within the cavity. The void preferably has an internal pressure of the air or gas therein. The void pressure is preferably approximately equal to the reflowing pressure.

The pressure level within the bulk metal layer deposition chamber and outside of the void may subsequently be elevated to a collapsing pressure level significantly above the reflowing pressure. Concurrent with or subsequent to increasing the pressure within the chamber, a second hot sputtered portion of a bulk metal layer may be hot sputter deposited in the bulk metal layer deposition chamber above the first hot sputtered portion of the bulk metal layer and within the cavity. The bulk metal layer primarily comprises aluminum. Because the present process allows for the formation of a void within a portion of a bulk metal layer arranged in a metallization cavity and for its subsequent collapse, the portion of the bulk metal layer within the metallization cavity is preferably substantially void-free.

Since the collapsing pressure is preferably significantly above the reflowing pressure (and thus, above, the void pressure within the void), void collapse can occur relatively fast. In other words, the collapsed void preferably fills the void much more rapidly than, e.g., reflow of the bulk metal layer could. In addition, collapse of the void preferably results in the remaining portion of the bulk metal layer within the cavity, and specifically within the first hot sputtered portion of the bulk metal layer, being substantially void-free. The present method thus also provides for a more complete, and more rapid, filling of large voids formed in a bulk metal layer than may be possible using only reflow.

In addition, a pre-cleaning process may be performed prior to the bulk metal deposition process. The pre-cleaning process preferably includes sputtering away a portion of the dielectric layer in which the cavity is defined such that the upper portions of the sidewalls of the cavity are tapered. A wetting layer may then be deposited within the cavity and upon the tapered upper portions of the cavity sidewalls prior to cold sputter depositing the cold sputtered portion of the bulk metal layer.

A metallization structure is also presented. The metallization structure preferably includes a bulk metal layer at least partially arranged in a cavity formed in a dielectric layer. The cavity preferably has an aspect ratio of at least 3:1, and more preferably of at least 4:1, and in some instances can properly fill a cavity having an aspect ratio exceeding 5:1. The cavity preferably has a width of at most 0.40 microns, and more preferably of at most 0.25 microns. Preferably, the bulk metal layer substantially fills the cavity and is substantially void-free.

BRIEF DESCRIPTION OF THE DRAWINGS

Other objects and advantages of the invention will become apparent upon reading the following detailed description and upon reference to the accompanying drawings in which.

Figure 1:
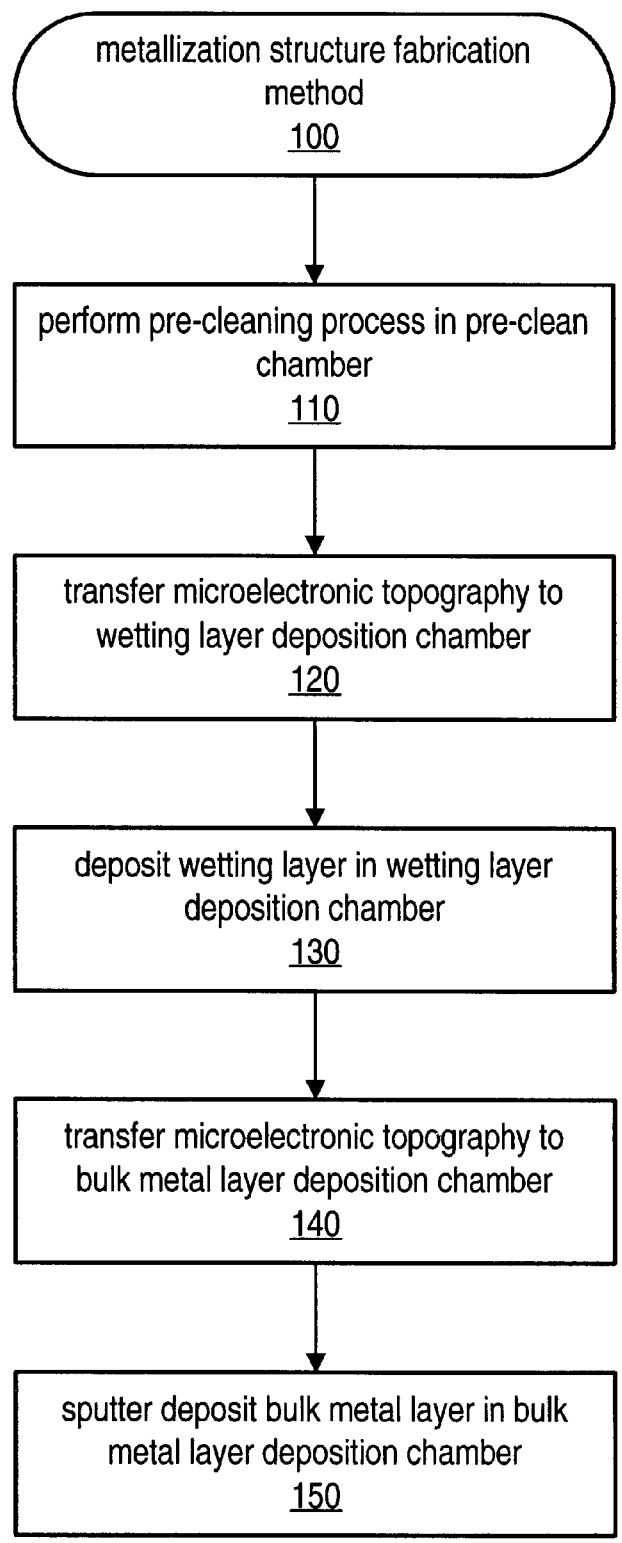
FIG. 1 is flow diagram of a metallization structure fabrication method in accordance with an embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIG. 1 presents a flow diagram of a method for fabricating a metallization structure in accordance with a preferred embodiment. Metallization structure fabrication method 100 illustrates a preferred embodiment of the present method. While there may be any number of processing steps performed before and after the steps shown in method 100, method 100 preferably includes a preliminary step 110 of performing a pre-cleaning process.

Figure 4:
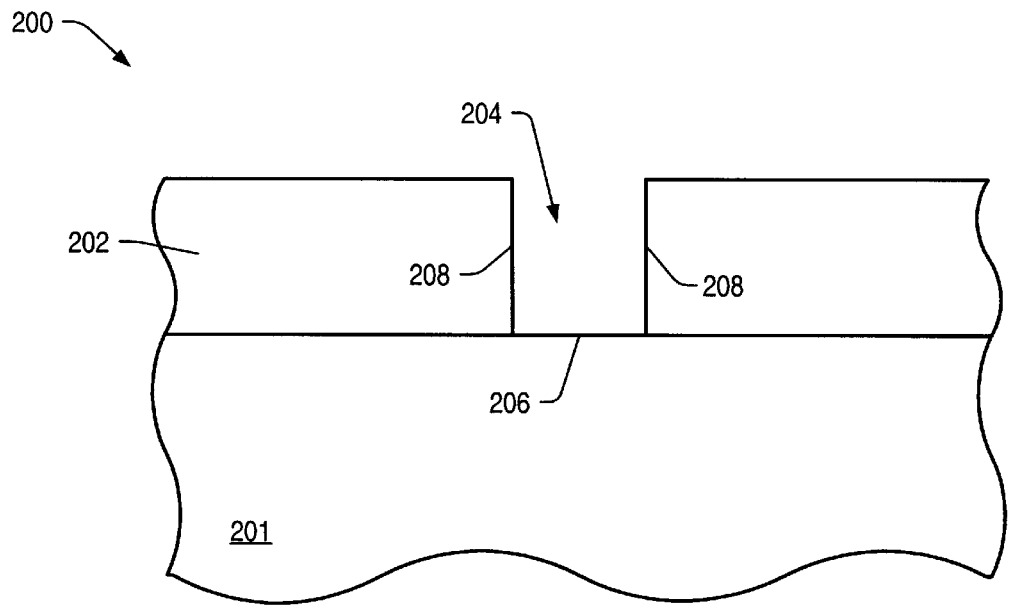
FIG. 4 is a partial cross-sectional view of a microelectronic topography, in which a dielectric layer having a cavity defined therein is arranged above the topography in accordance with an embodiment.

In FIG. 4, however, a cross-sectional view of a microelectronic topography suitable for use in an embodiment is shown as configured before performing step 110. Microelectronic topography 200 is shown with a dielectric layer 202 arranged above a lower portion 201 of the microelectronic topography. Microelectronic topography lower portion 201 may include a substrate and any layers and materials formed above the substrate from microelectronic products (e.g., semiconductor devices) may be produced. Preferably, microelectronic topography includes a semiconductor substrate, and more preferably a lightly doped, single-crystal silicon substrate. Active devices, such as MOS transistors, may be arranged upon and within the semiconductor substrate. The active devices may be isolated from each other using isolation structures. In an alternate embodiment, microelectronic topography lower portion 201 may include a substrate composed of a non-semiconducting material. Such non-semiconducting materials may include metals and ceramics.

Dielectric layer 202 is preferably arranged upon microelectronic topography lower portion 201. Dielectric layer 202 is preferably is composed of a material suitable for insulating metallization structures in integrated circuit fabrication. Dielectric layer 202 may serve as a topography for receiving subsequently deposited metal layers that can then be patterned. Alternatively, the dielectric layer 202 can be partially or completely removed in localized areas to form a via or "cavity". Dielectric layer 202 is shown as being composed of a material that can be patterned to form a metallization cavity and into which metals can be sputter deposited (and possibly planarized) to form a metallization structure, such as in a Damascene or dual-Damascene process. Suitable materials may include silicon dioxide (including fluorinated silicon oxides), silicon oxynitride, and several low dielectric constant materials. Several layers of materials not shown may exist between 202 dielectric layer and a substrate of microelectronic topography lower portion 201.

Cavity 204 is preferably defined in dielectric layer 202. Dielectric layer 202 preferably includes cavity sidewalls 208 arranged around the cavity. Cavity sidewalls 208 are preferably substantially vertical. Cavity 204 may extend from an upper surface of dielectric layer 202 to an upper surface of microelectronic topography lower portion 201 (i.e., cavity base 206). In an embodiment, cavity 204 may be configured as a via defined within the dielectric layer and extending to a conductive region of microelectronic topography lower portion 201. The conductive region may be, e.g., an underlying interconnect line or a conductive region of a device, such as a source/drain region of a semiconductor substrate. The cavity preferably is sized such that a void will be formed during the filling of cavity 204 with metallization materials. That is, the cavity is preferably of such stature in terms of width and aspect ratio that the deposition of metal layers as described below will result in the formation of keyhole void within cavity 204. Cavity 204 preferably has an aspect ratio of at least 4:1, and more preferably of at least 5:1. Cavity 204 preferably has a width of at most 0.25.

Figure 5:
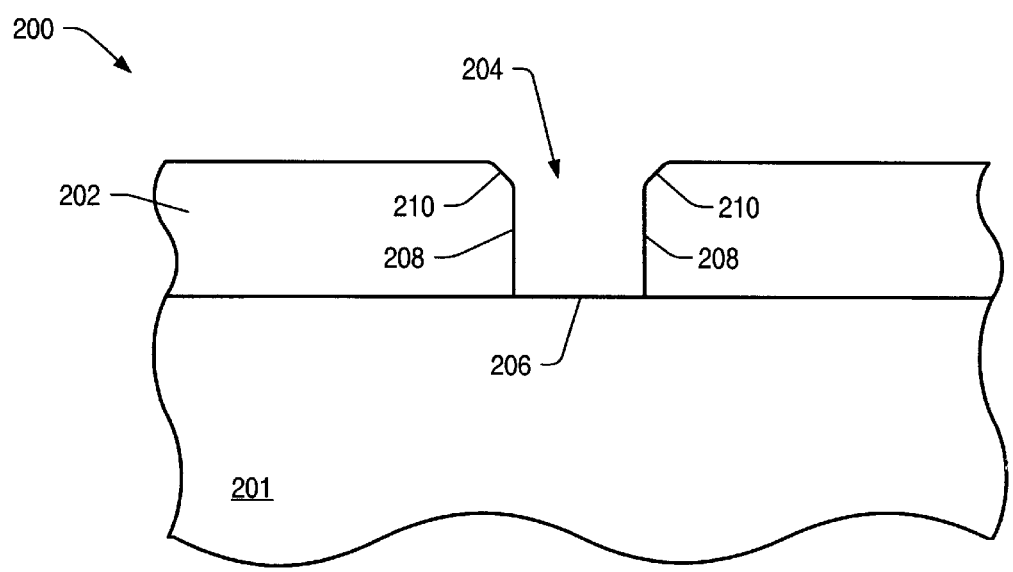
FIG. 5 is a partial cross-sectional view of the microelectronic topography, in which a pre-cleaning process sputters away an upper portion of the dielectric layer and tapers upper sidewalls of the cavity, according to a processing step subsequent to FIG. 4.

FIG. 5 presents a cross-sectional view of microelectronic topography 200 after performing pre-cleaning process 110. Pre-cleaning process 110 is preferably performed before depositing any metallic layers within cavity 204. Performing pre-cleaning process 110 preferably includes sputtering away an upper portion of dielectric layer 202, thus removing contamination configured upon an upper surface of the dielectric layer. Sputtering of the upper portion of dielectric layer 202 may be accomplished by inducing ionized argon atoms to impact the upper surface of dielectric layer 202 with sufficient energy to sputter away an upper portion of the dielectric layer 202. Sputtering of the dielectric layer during the pre-cleaning process preferably sputters away an upper portion of cavity sidewalls 208 such that cavity sidewall portions 210 become tapered. By tapering or "rounding off" upper portions 210 of the cavity sidewalls, the ability of any subsequently hot deposited aluminum to reflow into cavity 204 may be increased. This benefit may arise because tapering of cavity sidewall upper portions 210 provides the aluminum with a sloped entry point into cavity 204, which is believed to aid in reflowing of the aluminum into the cavity. Pre-cleaning process 110 preferably sputters away 200–250 angstroms of dielectric material from the upper portion of dielectric layer 202. The amount of sputtering is preferably controlled such that while upper portions 210 of cavity sidewalls 208 are tapered, upper portions 210 are not tapered to an inordinate extent (e.g., to an extent where they contribute to unwanted metal shadowing of the lower cavity sidewalls.)

In an embodiment, pre-cleaning process 110 may be performed in a sputter etch chamber. A sputtering gas, preferably an inert gas such as argon, may be introduced into the chamber. A plasma power is preferably applied to an ionizing element of the chamber to ionize the sputtering gas ions. (The quantity of ions generated may be controlled by the amount of this power.) A bias power may be applied to the pedestal upon which the microelectronic topography is situated for drawing ions toward the topography for sputtering the topography. (The bias power may control how hard these ions contact the topography.) By appropriately configuring these parameters, a desired etch rate of dielectric layer 202 can be achieved.

Referring back to FIG. 1, microelectronic topography 200 is preferably transferred to a wetting layer deposition chamber (step 120) after pre-cleaning process is complete. Transfer of the microelectronic topography between the pre-cleaning chamber and the wetting layer deposition chamber, and between two chambers in general in an embodiment, preferably is performed under high vacuum (e.g., $10^{-9}$ torr). The wetting layer may then be deposited into the cavity (step 130).

Figure 6:
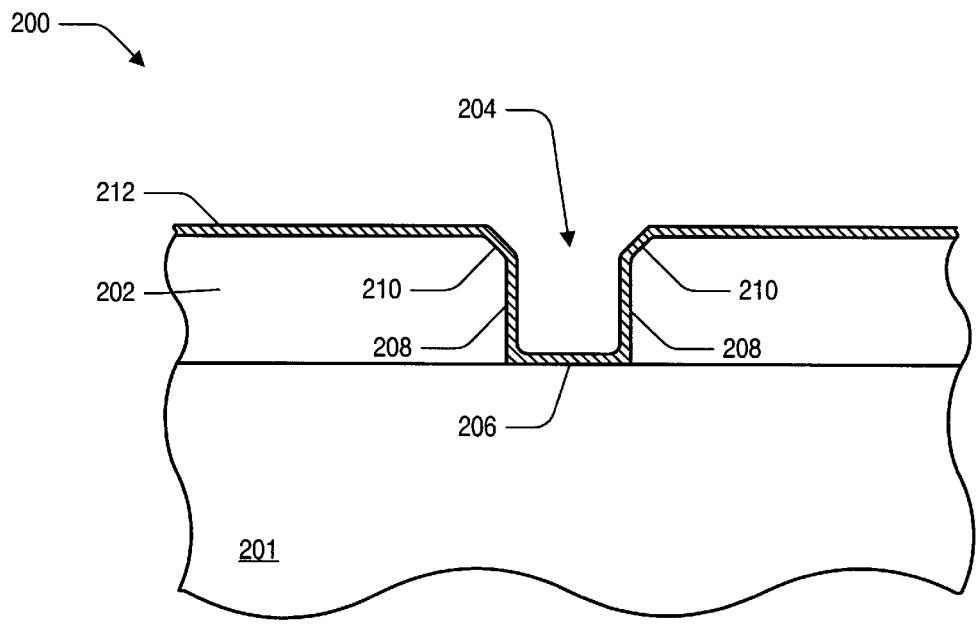
FIG. 6 is a partial cross-sectional view of the microelectronic topography, in which a wetting layer is deposited within the cavity and upon the dielectric layer, according to a processing step subsequent to FIG. 5.

FIG. 6 presents a cross-sectional view of the microelectronic topography after deposition of a wetting layer into the cavity. Wetting layer 212 is preferably deposited on the sidewalls 208 of cavity 204 and the upper surface of dielectric layer 202 outside of cavity 204. In addition, wetting layer 212 is preferably deposited on the tapered portions 210 of the cavity sidewalls. Wetting layer 212 may further be deposited on the upper surface of microelectronic topography lower portion 201 that is exposed by the cavity (cavity base 206). Alternately, if there are any layers (e.g., barrier layers) already upon cavity sidewalls 208 and/or 210, cavity base 206, and/or the upper surface of dielectric layer 202, than wetting layer 212 may be deposited on those layers instead. The coverage of wetting layer 212 over the cavity sidewalls and base, including the tapered portions of the cavity sidewalls, is preferably substantially even.

Wetting layer 212 preferably is primarily composed of titanium. (As set forth herein, "primarily" when used in terms of composition as in "primarily composed," "primarily includes," or "primarily comprises" is intended to indicate that the referenced material the largest single component on a molar basis of whatever the phrase is referring to). More preferably, wetting layer 212 is composed of relatively pure titanium (i.e., the wetting layer consists essentially of titanium) or a high titanium percentage titanium alloy. Wetting layer 212 is preferably relatively thin, perhaps 500 angstroms or less.

Wetting layer 212 may be sputter deposited. Preferably, the wetting layer is deposited in a collimated sputtered process. Alternately, the wetting layer may be deposited by methods of deposition other than sputter deposition, e.g., chemical vapor deposition (CVD). In an embodiment, the wetting layer is deposited in a wetting layer deposition chamber configured for collimated sputter deposition. The wetting layer deposition chamber may include a target, a collimator, and a pedestal. The wetting layer deposition chamber may be obtained and/or configured as a chamber in a multi-chamber system such as the Endura PVD 5500, available from Applied Materials (Santa Clara, Calif.).

The target in the wetting layer deposition chamber is preferably composed of a metal having the desired composition of the wetting layer to be deposited. Preferably, the target is primarily composed of titanium. More preferably, the target is composed of relatively pure titanium or a high titanium percentage titanium alloy. The target may be mounted to a target assembly that includes much of the structural and electric assembly related to the target. The target assembly may include magnetizing elements and mechanisms for operating such magnetizing elements. A target power supply may be operably coupled to the target assembly for applying power to the target. A target power supply is preferably configured to supply DC power to the target for ionizing and attracting sputtering gas atoms towards the target for sputtering metal off of the target during processing.

The collimator of the wetting layer deposition chamber is preferably arranged between the target and the pedestal. The collimator is preferably configured to filter out high impact angle metal atoms sputtered from the target while allowing lower impact angle atoms sputtered from the target to filter through.

The pedestal of the wetting layer deposition chamber is preferably located near a bottom of the chamber and may be adapted for supporting and retaining microelectronic topography 200 during processing. The pedestal is preferably configured to be in gaseous communication with a backside gas supply for applying a gas to the backside of microelectronic topography 200. The backside gas supply is preferably configured to provide a thermally conductive gas, and more preferably an inert gas such as argon, to the backside of microelectronic topography 200. The pedestal may be further configured as an electrostatic or mechanical chuck, and may be grounded.

In an embodiment, once microelectronic topography 200 is transferred to the wetting layer deposition chamber, it may be positioned above, and preferably upon, the pedestal. Once the topography is secured on the pedestal, a sputtering gas may be introduced into the chamber. The sputtering gas is preferably an inert gas such as argon. The flow rate of the sputtering gas into the wetting layer deposition chamber may vary depending on processing goals. The flow rate of the sputtering gas is preferably about 14–26 standard cubic centimeters per second (sccm), is more preferably about 18–22 sccm, and is optimally about 20 sccm. A gas may also be flowed from the backside gas supply onto the backside of microelectronic topography 200. The backside gas used is preferably argon. The backside gas flow rate may be about 15 sccm, but may be altered subject to processing considerations. A pumping system connected to an outlet of the wetting deposition chamber is preferably actuated to evacuate gases and byproducts from the chamber to maintain a desired level of vacuum with the chamber.

Subsequently, power may be applied to various components of the wetting layer deposition chamber for depositing wetting layer 212 above microelectronic topography 200. For example, power may be applied to the target to induce sputtering of metal atoms from the target. A DC power is preferably applied to the target. Preferably, the amount of a DC power applied to the target may be about 12–24 kW, is more preferably about 16–20 kW, and is optimally about 18 kW. The metal atoms sputtered from target may be filtered through the collimator to deposit upon an upper surface of microelectronic topography 200, to form wetting layer 212. The length of time for which power is applied will depend on, among other things, the particular quantity applied and the thickness of the wetting layer to be deposited.

After a wetting layer 212 of the desired thickness has been formed, deposition of the wetting layer may be terminated. Referring back to FIG. 1, microelectronic topography 200 may then be transferred from wetting layer deposition chamber 300 into a bulk layer deposition chamber (step 140). Again, transfer of the microelectronic topography between chambers is preferably done under high vacuum. The microelectronic topography is preferably immediately transferred to the bulk metal deposition chamber after deposition of the wetting layer is complete. In any case, bulk metal layer deposition 150 is preferably the first metal deposition process performed on the microelectronic topography after depositing the wetting layer. That is, while other processing steps may be performed in between deposition of the wetting layer and the deposition of the bulk metal layer, e.g. cleaning processes, there are preferably no intervening processes between steps 130 and 150 in which a metal layer is deposited.

Figure 2:
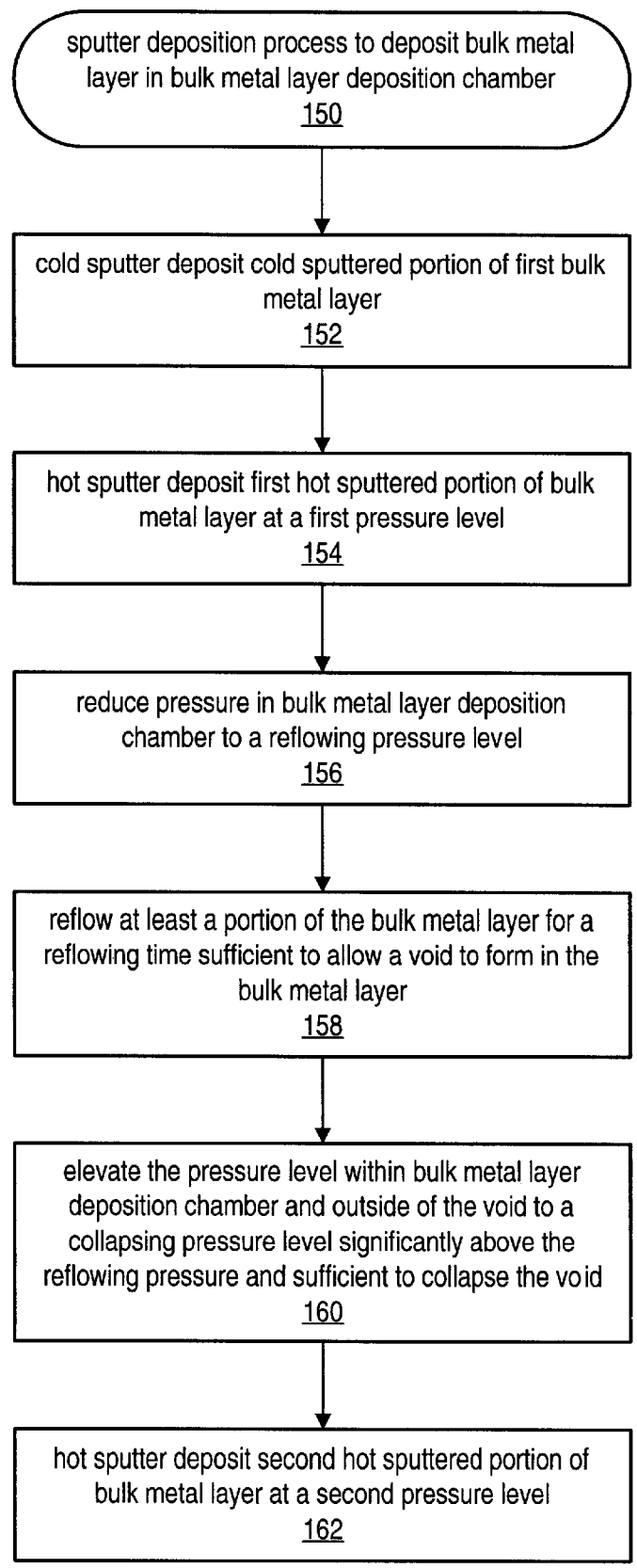
FIG. 2 is flow diagram of a sputter deposition process to deposit a bulk metal layer in a bulk metal layer deposition chamber that may be performed as part of the method shown in FIG. 1.

FIG. 2 presents a flow diagram of processing steps that may be performed as part of sputter deposition process 150 to deposit a bulk metal layer in a bulk metal layer deposition chamber in an embodiment. The bulk metal layer deposition process preferably includes cold sputter depositing a cold sputtered portion of the bulk metal layer (processing step 152). A first hot sputtered portion of a bulk metal layer may subsequently be sputter deposited within a cavity defined in a dielectric layer and above the cold sputtered portion of the bulk metal layer (processing step 154). The bulk metal layer deposition chamber preferably has a first pressure level during deposition of the first hot sputtered portion of the bulk metal layer. Subsequently, the pressure level within the bulk metal deposition chamber may be reduced to a reflowing pressure level significantly below the first pressure level (processing step 156). Reducing the pressure preferably encompasses the process(es) of initiating the reducing in pressure, achieving the reduction in pressure and maintaining the reduction in pressure until the desired time. During the reducing of the pressure level within the chamber, the first hot sputtered portion of the bulk metal layer may be reflowed for a reflowing time sufficient to allow a void to form at least partially within the cavity by reflow of at least a portion of the bulk metal layer arranged within the cavity (processing step 158). The void preferably has a having a void pressure approximately equal to the reflowing pressure. The pressure level within the bulk metal layer deposition chamber and outside the void may subsequently be elevated to a collapsing pressure level significantly above the reflowing pressure and sufficient to collapse the void (processing step 160). Concurrent with or subsequent to increasing the pressure within the bulk metal chamber, a second hot sputtered portion of a bulk metal layer may be hot sputter deposited in the bulk metal layer deposition chamber above the first hot sputtered portion of the bulk metal layer and within the cavity (processing step 162). The bulk metal layer primarily comprises aluminum. Because the present process allows for the formation of a void within a portion of a bulk metal layer within a metallization cavity and for its subsequent collapse, the portion of the bulk metal layer within the metallization cavity is preferably is substantially void-free.

Figure 3:
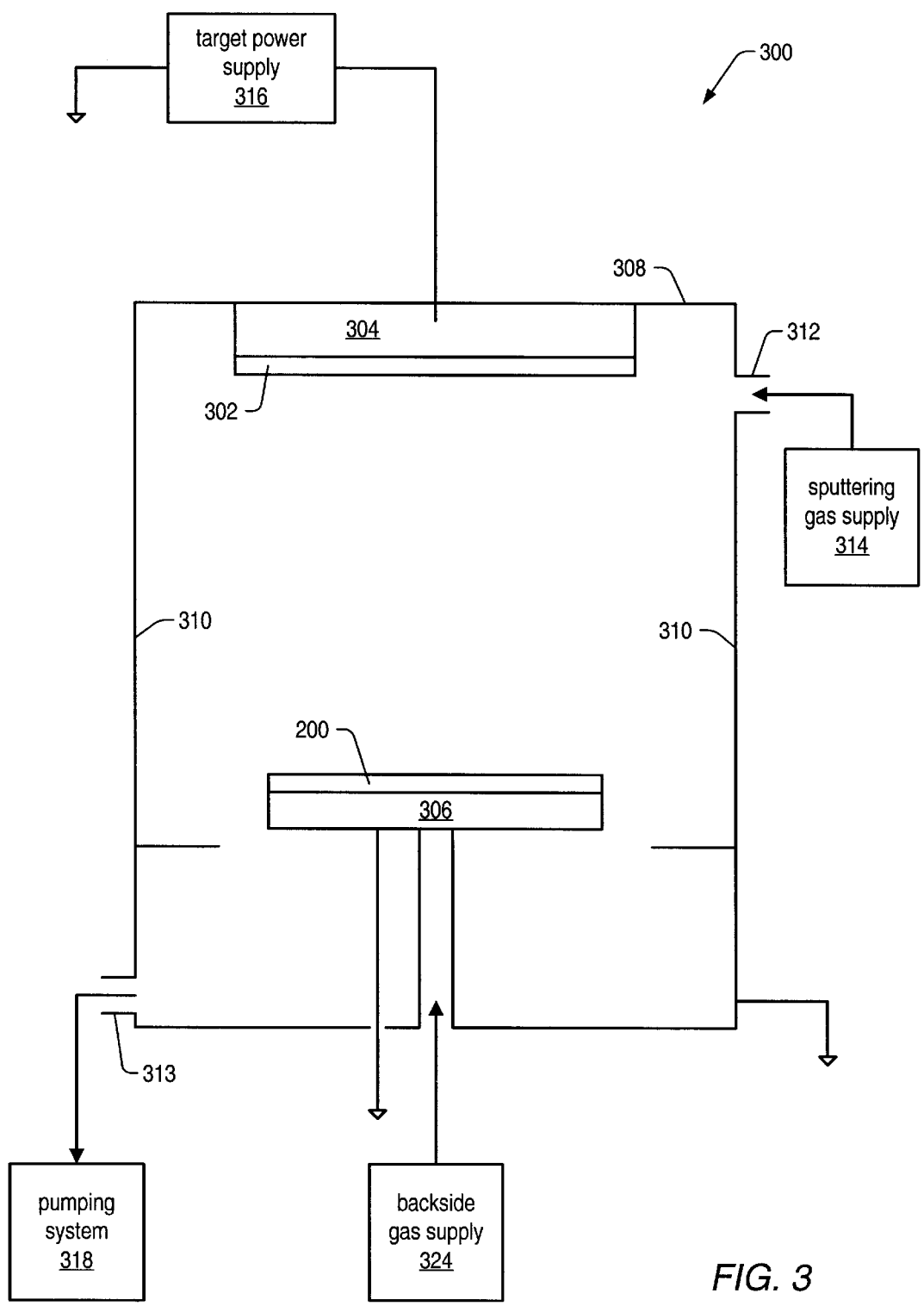
FIG. 3 is a schematic view of a bulk metal layer deposition chamber suitable for sputter depositing a bulk metal layer in an embodiment.

FIG. 3 presents a schematic view of a reactor suitable to perform bulk layer deposition process 150. Bulk metal layer deposition chamber 300 may include a target 302 and a pedestal 306. Microelectronic topography 200 may be placed upon pedestal 306 during deposition of a bulk metal layer in chamber 300. Bulk metal layer deposition chamber 300 is preferably configured to perform sputter deposition processes. Deposition chamber 300 may also be obtained and/or configured as a chamber in a multi-chamber system such as the Endura PVD 5500, available from Applied Materials (Santa Clara, Calif.).

Target 302 is preferably attached to a target assembly 306 fixably coupled to a top wall 308 of chamber 300. Target 302 is preferably composed of a metal having the desired composition of the bulk metal layer to be deposited. Preferably, target 302 is primarily composed of aluminum or an aluminum alloy. Target assembly 304 preferably includes the structural and electric assembly related to target 302. Target assembly 304 may also include magnetizing elements and mechanisms for operating such magnetizing elements. A target power supply 316 may be operably coupled to target assembly 304 for applying power to target 302. Target power supply 316 is preferably configured to supply DC power to target 302 for ionizing and attracting sputtering gas atoms towards the target for sputtering metal off of the target during processing.

Pedestal 306 is preferably located near a bottom of chamber 300 and is preferably adapted for supporting and retaining microelectronic topography during 200 processing. Pedestal 306 is preferably configured to be in gaseous communication with a backside gas supply 324 for applying a gas to the backside of microelectronic topography 200. Backside gas supply 324 is preferably configured to provide a thermally conductive gas, and more preferably an inert gas such as argon, to the backside of microelectronic topography 200. Pedestal 306 may be configured as an electrostatic or mechanical chuck. The pedestal may be grounded. Alternately, pedestal 306 may be operably coupled to an AC or DC power supply.

The bulk metal layer deposition chamber may include a gas inlet 312 coupled to one of chamber sidewalls 310 for allowing gases to be introduced into the chamber. Gas supplies may be coupled to gas inlet 312 for introducing gases into the chamber. Preferably, a sputtering gas supply is coupled to gas inlet 312 for introducing sputtering gases into chamber 300. The sputtering gases preferably include an inert gas, such as argon.

A gas outlet 313 may be configured at a bottom of chamber 300 for exhausting gases and other substances from the chamber during processing. Gas outlet 313 may be connected to a pumping system 318 including one or more vacuum pumps, and possibly a roughing pump as well. Pumping system 318 is preferably configured to create very high levels of vacuum in the chamnber. The base pressure, or idle pressure, of a chamber is preferably the pressure within the chamber when no gases are coming into the chamber and the chamber pumping system is pumping down at its maximum rate. In other words, the base pressure is the lowest steady-state pressure achievable in a vacuum chamber. Deposition chamber 300 preferably has a base pressure of $10^{-8}$–$10^{-9}$ torr.

Figure 7:
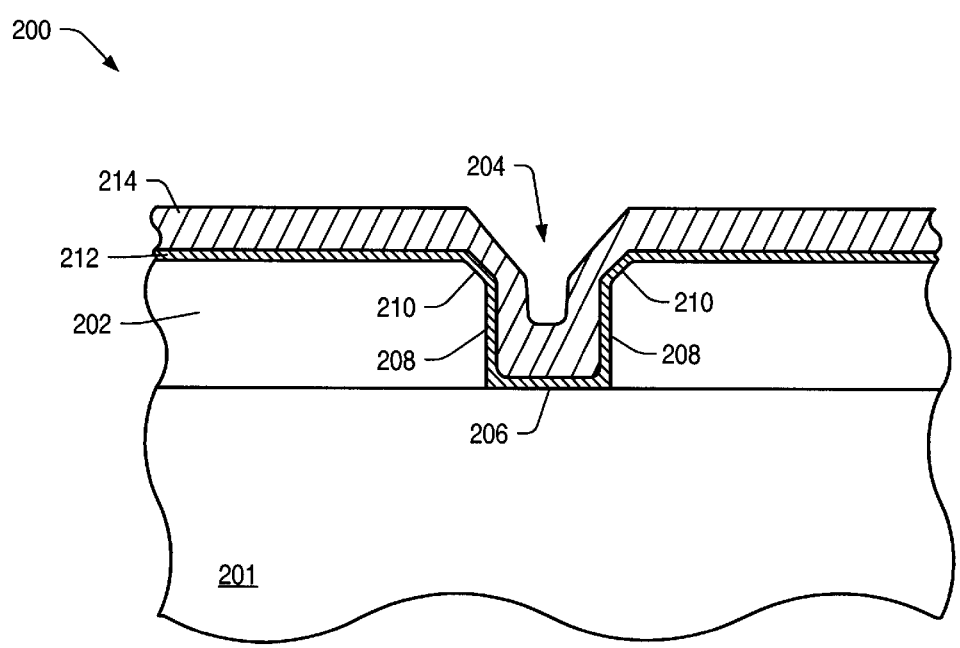
FIG. 7 is a partial cross-sectional view of the microelectronic topography, in which a cold sputtered portion of a bulk metal layer is cold sputter deposited within the cavity and upon the wetting layer, according to a processing step subsequent to FIG. 6.

FIG. 7 presents a cross-sectional view of microelectronic topography 200 after cold sputter depositing 152 the cold sputtered portion of the bulk metal layer into the cavity. In a preferred embodiment, cold sputtered portion 214 of the bulk metal layer may be deposited above, and more preferably directly upon, wetting layer 212 both within and outside of cavity 204. Cold sputtered portion 214 of the bulk metal layer is preferably deposited by cold sputter deposition such that immediately after being deposited, the cold sputtered portion of the bulk metal layer is not configured to significantly reflow. That is, while it may be made to reflow subsequently, it is preferably not configured or capable of reflowing immediately after being deposited. After being deposited, the cold sputtered portion of the bulk metal layer preferably does not fill cavity 204.

Referring back to FIG. 3, cold sputter depositing 152 of cold sputtered portion 214 may be performed in bulk metal layer deposition chamber 300 in an embodiment. Once microelectronic topography 200 is transferred to bulk metal layer chamber 300, it may be positioned above, and preferably upon, pedestal 306. Cold sputtering of cold sputtered portion 214 of the bulk metal layer may then begin. Once topography 200 is secured on pedestal 306, a sputtering gas may be introduced into chamber 300 from sputtering gas supply 314. The sputtering gas is preferably an inert gas such as argon. The flow rate of the sputtering gas into wetting layer deposition chamber 300 may vary depending on processing goals. The flow rate of the sputtering gas into bulk metal layer deposition chamber 300 is preferably about 25–55 sccm, more preferably about 35–45 sccm, and optimally about 40 sccm. During cold sputtering of cold sputtered portion 214 of the bulk layer, backside gas is preferably not supplied to the backside of microelectronic topography 200. The pumping system is preferably actuated to evacuate gases and byproducts from chamber 300 to maintain a desired level of vacuum with the chamber.

Subsequently, power may be applied to various components of bulk metal layer deposition chamber 300 for depositing cold sputtered portion 214 of the bulk metal layer above microelectronic topography 200. Preferably, DC power may be applied to target 302 for inducing the sputtering of metal atoms from target 302 and toward pedestal 306. (Alternately, AC power may be applied to the target.) The metal atoms sputtered from the pedestal preferably primarily include aluminum or an alloy of aluminum. In a preferred embodiment, the DC power applied to target 302 during cold sputter depositing may be about 6–12 kW, more preferably about 8–10 kW, and optimally about 9 kW. The length of time for which power is applied will depend on, among other things, the particular quantity applied and the thickness of metal to be deposited. The supply of DC power to target 302 may be maintained for about 12 seconds in an embodiment. After cold sputtered portion 214 of the bulk metal layer has been deposited to a desired thickness, the deposition parameters of chamber 300 may be reconfigured to perform the remaining steps of bulk layer deposition process 150.

Figure 8:
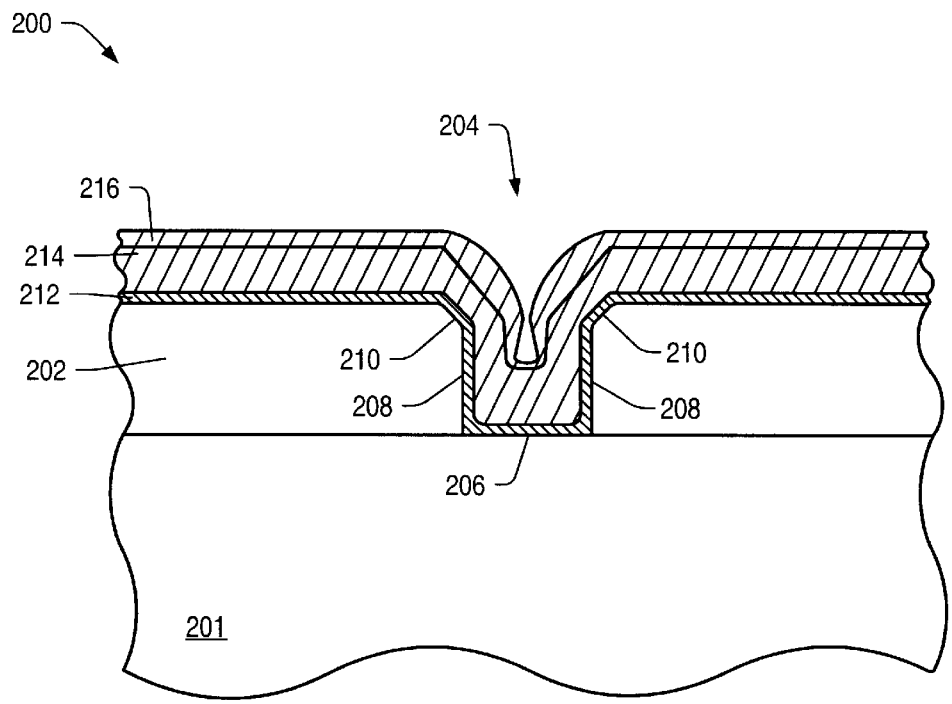
FIG. 8 is a partial cross-sectional view of the microelectronic topography, in which a first hot sputtered portion of the bulk metal layer is hot sputter deposited within the cavity and upon the cold sputtered portion of the bulk metal layer, according to a processing step subsequent to FIG. 7.

FIG. 8 presents a cross-sectional view of microelectronic topography 200 in which first hot sputtered portion 216 of the bulk metal layer is hot sputter deposited into cavity 204 (processing step 154). First hot sputtered portion 216 of the bulk metal layer may be deposited above, and more preferably directly upon, cold sputtered portion 214 of the bulk metal layer both within and outside of cavity 204. First hot sputtered portion 216 of the bulk metal layer is preferably deposited by hot sputter deposition such that immediately after being deposited, first hot sputtered portion 216 of the bulk metal layer is configured to significantly reflow. That is, it is preferably at a temperature sufficiently high that it may be capable of reflowing immediately after being deposited. After being deposited, first hot sputtered portion 216 of the bulk metal layer preferably does not fill cavity 204.

As shown in FIG. 8, hot sputtered portion 216 is preferably deposited such that it is capable of forming a void. In FIG. 8, hot sputtered portion 216 is shown at a point in time before a void is formed. First hot sputtered portion 216 is shown overhanging the sidewalls and floor of the cavity. If deposition of first hot sputtered portion is continued too long beyond the stage shown in FIG. 8, the metal layer may eventually close the opening of the cavity to form a void. A void formed during normal deposition conditions of first hot sputtered portion 216 may have a void pressure equal to the first pressure level within the chamber during deposition. Since such a void pressure level is higher than is desired, hot sputter depositing of first hot sputtered portion 216 of the bulk metal layer is preferably terminated before a void forms within cavity 204. This allows for reflow of the first hot sputtered portion to form a void in a subsequent step in which the pressure within the chamber is lower than during deposition of first hot sputtered portion 214, which will facilitate the subsequent collapsing of the void.

In an embodiment, hot sputter deposition of first hot sputtered portion may be performed in bulk metal layer deposition chamber 300. Transitioning from cold sputter depositing to hot sputter depositing from target 302 preferably involves changing one or more process parameters for the settings during cold sputter deposition. For example, the flow rate of sputtering gas into chamber 300 is preferably increased to about 70–130 sccm. More preferably, the flow rate of sputtering gas for the hot sputtering process into the chamber is set at about 90–110 sccm, and optimally at about 100 sccm. There is preferably no substantial (e.g., more than a few seconds) discontinuation of sputtering gas flow when shifting from the cold sputtering parameters to the hot sputtering parameters. In addition, backside flow of an inert gas is preferably initiated from backside gas supply 324. Preferably, about 36–44 sccm, and preferably about 40 sccm, of argon is flowed onto the backside of microelectronic topography 200. Deposition chamber 300 preferably has a first pressure level during deposition of first hot sputtered portion 216. Preferably, the first pressure level is about 4 mT. In addition, the pedestal temperature preferably increases from cold sputter depositing to hot sputter depositing; preferably, the pedestal temperature during hot sputter depositing is greater than 300° C.

The DC power applied to target 302 during hot sputter depositing is preferably reduced from the DC power applied during cold sputter depositing. The DC power to target 302 during hot sputtering of second portion 216 of the bulk metal layer is preferably set at about 260–540 W, more preferably at about 360–440 W, and optimally at about 400 W. The ramp-down of power when going from cold sputtering to hot sputtering is preferably undertaken without substantially diminishing the power applied to target 302.

Hot sputter deposition of first hot sputtered portion 216 is preferably continued for a time sufficient to deposit a desired thickness of first hot sputtered portion 216. Preferably, hot sputtered portion 216 is deposited thickly enough to deposit an amount of metal within and adjacent to cavity 204 sufficient to form a void by reflow in subsequent processing steps. Consequently, hot sputter depositing of first hot sputtered portion 216 is preferably continued long enough to deposit a thickness of first hot sputtered portion 260 sufficient to allow for reflowing of hot sputtered portion 216 in a subsequent step to form a void. As implied above, however, hot sputter deposition of first hot sputtered portion 216 should preferably not be continued so long that a void forms before the pressure within deposition chamber 300 is reduced to a level below the first pressure level (i.e., the pressure level during deposition of first hot sputtered portion 216). Ideally, hot sputter deposition of first hot sputtered portion 216 is continued until just a few seconds (e.g., 3 to 4 seconds) before the first void is expected to form in hot sputtered portion 216. (In a preferred embodiment, this will allow sufficient time for the pressure within chamber 300 to be reduced to base pressure.) In an embodiment, hot sputter deposition of first hot sputtered portion 216 is preferably continued for at least about 20 seconds. Preferably, hot sputter deposition of first hot sputtered portion 216 is preferably continued for about 40 seconds.

Once the desired thickness of first hot sputtered portion 216 have been achieved, or is close to being achieved, the pressure within the bulk metal layer deposition chamber may be reduced to a reflowing pressure level (processing step 156). Reducing the pressure within chamber 300 preferably includes decreasing the flow rate of the sputtering gas from sputtering gas supply 314 into chamber 300 (preferably to about zero). The pumping rate of pumping system 318 preferably remains substantially unchanged during reducing the pressure within chamber 300, so reducing the flow rate of sputtering gas into the chamber preferably results in a reduction of the pressure level within the chamber. In an embodiment, reducing the flow rate of sputtering gas into chamber 300 results in the pressure level within chamber 300 being reduced to less than about one mT. As noted above, reducing the pressure preferably encompasses the process(es) of initiating the reducing in pressure, achieving the reduction in pressure, and maintaining the reduction in pressure until the desired time (e.g., when increasing the pressure level within the chamber, step 160 begins).

Preferably, reducing the pressure within chamber 300 further includes terminating hot sputter deposition of first hot sputtered portion 216 of the bulk metal layer. Hot sputter deposition of first hot sputtered portion 216 of the bulk metal layer is preferably terminated by, among other things, terminating the flow of the sputtering gas into bulk metal layer deposition chamber 300 and terminating the applying of power to target 302. Without a sputtering gas flow into the chamber, and without power applied to the target, sputtering of metal atoms from target 302 preferably will terminate shortly thereafter. After termination of the hot sputter deposition of first hot sputtered portion 216, first hot sputtered portion 216 is preferably devoid of voids.

Since pumping system 318 is still preferably actuated during this period, terminating the flow of sputtering gas into the chamber preferably reduces the pressure within the chamber to a pressure approximately equal to the base pressure of chamber 300. In an embodiment, the base pressure of chamber 300 is at most about $10^{-8}$ torr. Thus, in an embodiment, reducing the pressure level within chamber 300 includes reducing the pressure to a reflowing pressure approximately equal to the base pressure of chamber 300. Reducing the pressure level within chamber 300 to a pressure level approximately equal to the base pressure chamber 300 may be accomplished relatively quickly, preferably within 3–4 seconds. Consequently, a void 218 formed when a pressure within chamber 300 is at such a reflowing pressure may have a void pressure approximately equal to the reflowing pressure, or to the base pressure of chamber 300.

Although the pressure within the chamber is preferably reduced to the reflowing pressure in processing step 156, that does not require that the reflowing pressure be the lowest pressure to which the chamber is reduced. Rather, the reflowing pressure is preferably the pressure in chamber 300 during the bulk of the reflowing process (particularly after the first 5 seconds), which will be subsequently described in greater detail (with respect to processing step 158). Consequently, in an embodiment in which dielectric layer 202 includes a plurality of cavities, the reflowing pressure is preferably the pressure within chamber 300 when the majority of voids form in the portions of the bulk metal layer within the cavities. In such a manner, the majority of the voids may be made to have void pressures approximately equal to the reflowing pressure. In any event, once the pressure within the chamber has been reduced to the reflowing pressure level, the chamber pressure level during reflowing is preferably maintained at or below the reflowing pressure during the reducing of the pressure level within the chamber.

Figure 9:
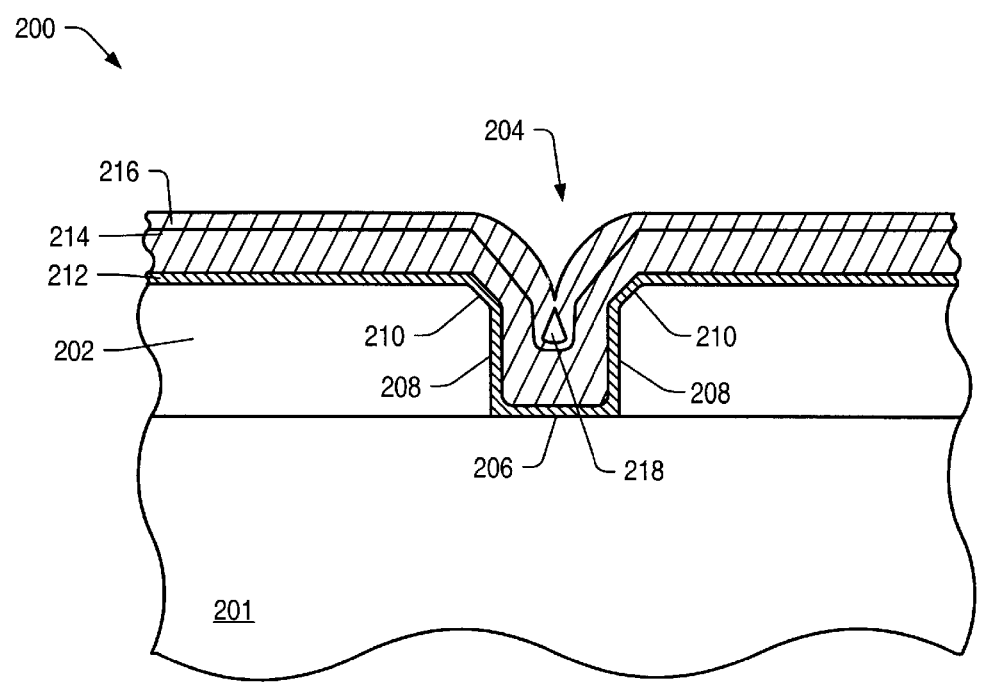
FIG. 9 is a partial cross-sectional view of the microelectronic topography, in which pressure in the bulk metal layer chamber is reduced to a reflowing pressure level, and in which at least a portion of the bulk metal layer is reflowed for a reflowing time sufficient to allow a void to form in the bulk metal layer, according to a processing step subsequent to FIG. 8.

FIG. 9 presents a partial cross-sectional view of the microelectronic topography 200 in which at least a portion of the bulk metal layer is reflowed for a reflowing time sufficient to allow a void to form in the bulk metal layer. As shown in FIG. 9, first hot sputtered portion 216 may be reflowed for a reflowing time sufficient to allow void 218 to form. Void 218 is preferably defined at least partially within cavity 204. Formation of void 218 by reflowing of at least first hot sputtered portion 216 preferably occurs while the pressure within chamber 300 is reduced to the reflowing pressure. Preferably, the reflowing time is sufficient to allow void 218 to form such that the void pressure within void 218 is at most substantially equal to the reflowing pressure within chamber 300. More preferably, reflowing of first hot sputtered portion 216 to form void 218 may be performed at a reflowing pressure approximately equal to the base pressure of chamber 300. In such a case, the void pressure within void 218 may be approximately equal to the base pressure of chamber 300. Void 218 may be surrounded entirely by first hot sputtered portion 216. Alternately, void 218 maybe surrounded by, e.g., first hot sputtered portion 216 and cold sputtered portion 214.

Reflowing of first hot sputtered portion 216 may be considered to begin at or shortly after the initiation of the reduction of pressure within chamber 300. As noted above, the reflowing time is preferably sufficiently long to allow first hot sputtered portion 216 to reflow to form void 218. Choosing an optimal reflowing time, however, may be complex; the optimal reflowing time may be highly dependent on several factors, including cavity width, aspect ratio, amount of metal deposited in the cavity, and the composition of the metal deposited. In an embodiment in which cavity 204 has a 0.25 micron critical dimension, the reflowing time is preferably at least about 5 seconds. A reflowing time of at least about 5 seconds will preferably allow chamber 300 to be pumped down to base pressure before the first void forms in the bulk metal layer. More preferably, the reflowing time is about 15–60 seconds. Reflowing for too long (e.g., more than about one minute), especially after the deposition of first hot sputtered portion 216 has been terminated, may be disadvantageous in that an inordinately long reflowing time may allow microelectronic topography 200 to cool down to too great an extent. Optimally, the reflowing time is about 30 seconds. In any event, the reflowing time is preferably sufficient long that all voids that may potentially form within the bulk metal layer, and particularly within cavities defined in the bulk dielectric layer, will be formed by reflow. Thus, all such voids in the bulk metal layer will be low-pressure voids that can be easily collapsed when the pressure within chamber 300 is subsequently increased to a collapsing pressure.

Figure 10:
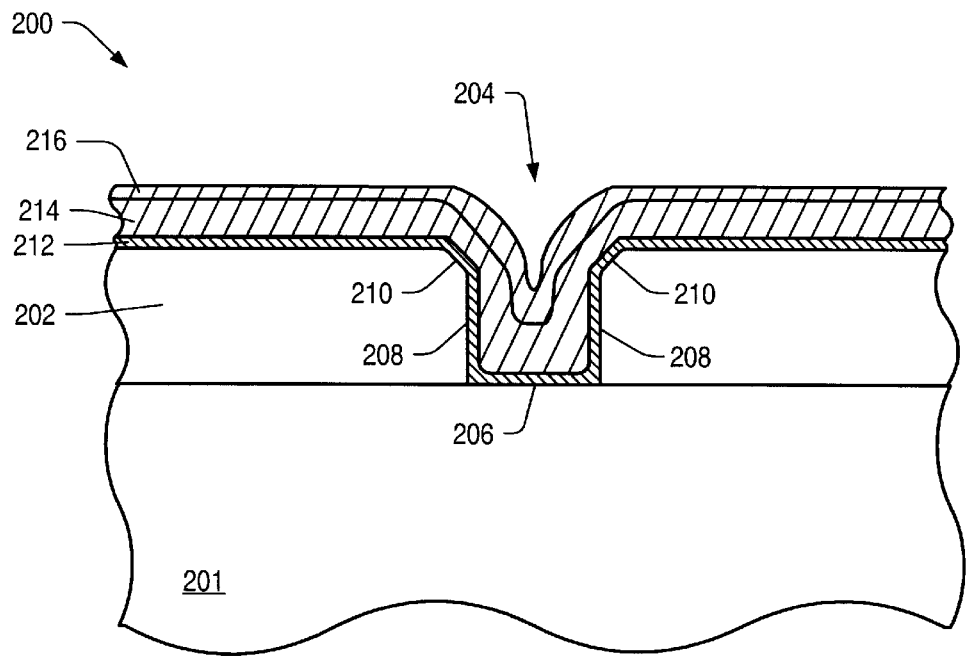
FIG. 10 is a partial cross-sectional view of the microelectronic topography, in which pressure within the bulk metal layer deposition chamber and outside of the void is increased to a collapsing pressure level significantly above the reflowing pressure and sufficient to collapse the void, according to a processing step subsequent to FIG. 9.

FIG. 10 presents a partial cross-sectional view of microelectronic topography 200 in a a subsequent processing step, in which void 218 is collapsed by increasing the pressure outside the void to a collapsing pressure sufficient to collapse the void. The collapse of the void is preferably induced by the pressure differential between the void pressure of void 218 and the collapsing pressure preferably just outside of void 218. In other words, the pressure difference between the collapsing pressure level and the pressure level within void 218 is preferably sufficient to exert enough force upon the metal surrounding cavity 218 to cause the void to collapse. (Note, however, that the collapsing pressure may be greater than the actual pressure level that is minimally sufficient to cause the collapse of the void.) Increasing a pressure outside the void preferably includes increasing a pressure within bulk metal layer deposition chamber 300.

Preferably, the collapse of the void into the cavity helps to achieve the goal of high fill of the cavity. As noted previously, voids often form when attempting to sputter deposit metals into narrow, high aspect ratio cavities. If allowed to remain in final metallization structure, the voids can prevent the structure from forming as desired. The present process, however, may collapse such voids by increasing the pressure level within the deposition chamber to a collapsing pressure level that is sufficient to collapse the voids. The collapsed void thus collects at the bottom of the unfilled portion of the cavity. Effectively, the collapse of the void reduces the aspect ratio of the portion of the cavity yet to be filled. The remaining unfilled portion of the cavity can subsequently be easily filled, preferably resulting in a metallization structure having excellent fill characteristics.

Because the collapsing pressure is preferably significantly above the reflowing pressure (and thus, preferably, the void pressure within void 218), collapsing of void 218 may be a relatively sudden mechanism. In other words, collapsing of void 218 because of a collapsing pressure outside of the void preferably fills void 218 much more rapidly than, e.g., reflow of the bulk metal layer could. In an embodiment, the collapsing of void 218 may fill void 218 so rapidly that the section of first hot sputtered portion 216 surrounding the via may appear to be rapidly sucked into the via. In addition, collapse of via 218 preferably results in the remaining portion of the bulk metal layer within cavity 204, and specifically within hot sputtered portion 216 of the bulk metal layer, being substantially void-free. The present method thus also provides for a more complete filling of large voids formed in a bulk metal layer than may be possible using only reflow. Note, however, that void 218 may also be at least partially filled by reflow, but it should be understood that filling of void 218 by pressure-induced collapse and by reflow are preferably separate void-filling mechanisms.

As noted above, the collapsing pressure level may be significantly above the reflowing pressure level, and is preferably a pressure level sufficiently high to induce the collapse of the void. More specifically, the collapsing pressure level is preferably at least an order of magnitude above the reflowing pressure, more preferably at least two orders of magnitude above the reflowing pressure, still more preferably at least three orders of magnitude above the reflowing pressure, still more preferably at least four orders of magnitude above the reflowing pressure, and optimally at least five orders of magnitude above. The collapsing pressure level is preferably greater than 1 mT.

Increasing 160 the pressure level within deposition chamber 300 is preferably performed immediately after reflowing 158 for a reflowing time. That is, increasing the pressure level is preferably performed before, e.g., first hot sputtered portion 216 has cooled off to the extent where it may no longer be considered to significantly reflow. Increasing the pressure level within the deposition chamber preferably involves increasing the flow rate of sputtering gas into chamber 300. In an embodiment, increasing the pressure level includes increasing the flow rate of sputtering gas into chamber 300 from a flow rate of zero. Increasing the pressure level within the chamber is preferably carried out concurrently with, or shortly before, hot sputtered depositing a second hot sputtered portion of the bulk metal layer above microelectronic topography 200. Preferably, increasing the pressure level includes increasing a flow rate of sputtering gas into chamber 300 to a flow rate approximately equal to a flow rate used during the deposition of the second hot sputtered portion of the bulk metal layer.

Figure 11:
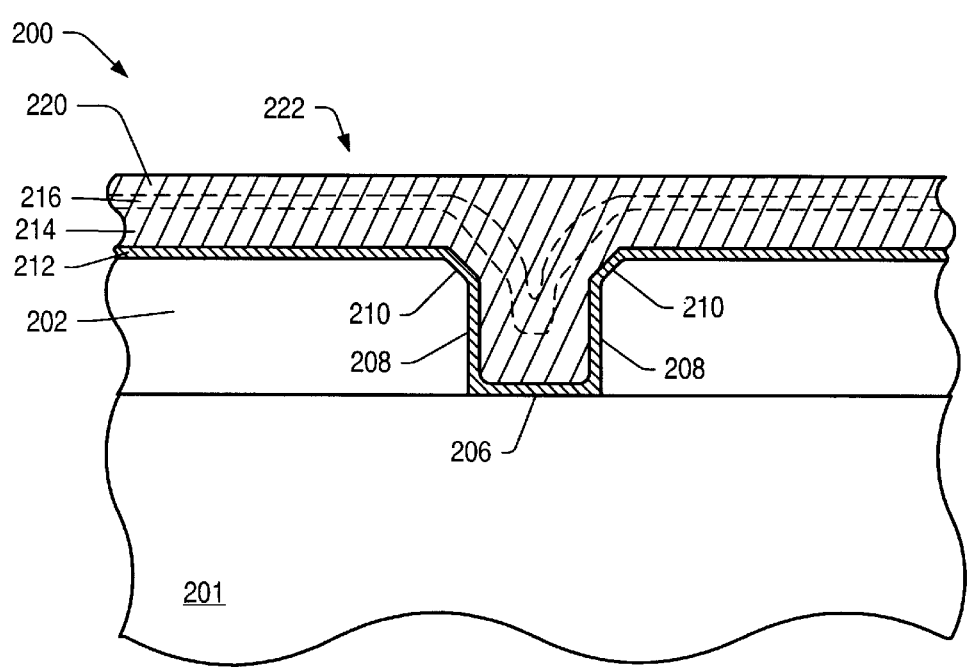
FIG. 11 is a partial cross-sectional view of the microelectronic topography, in which a second hot sputtered portion of the bulk metal layer is hot sputter deposited upon the first hot sputtered portion of the bulk metal layer such that after the second hot sputtered portion is deposited the upper surface of the bulk metal layer is substantially planar, according to a processing step subsequent to FIG. 10.

FIG. 11 presents a cross-sectional view of microelectronic topography 200 in which second hot sputtered portion 220 of the bulk metal layer is hot sputter deposited into and above cavity 204 (processing step 162). Second hot sputtered portion 220 of the bulk metal layer may be deposited above, and more preferably directly upon, first hot sputtered portion 216 of the bulk metal layer both within and outside of cavity 204. In particular, second hot sputtered portion 220 is preferably deposited upon the collapsed portion of first hot sputtered portion 216. Second hot sputtered portion 220 of the bulk metal layer is preferably deposited by hot sputter deposition such that immediately after being deposited, second hot sputtered portion 220 of the bulk metal layer is configured to significantly reflow. Second hot sputtered portion 220 of the bulk metal layer preferably substantially fills cavity 204 after deposition. In addition, the upper surface of second hot sputtered portion 220 is preferably substantially planar after deposition.

Preferably, the processing parameters (e.g., power to target 302, sputtering gas flow rate, backside gas pressure) for hot sputter deposition of second hot sputtered portion 220 are preferably equal to the processing parameters for hot sputter deposition of second hot sputtered portion 220. Accordingly, hot sputter deposition of second hot sputtered portion 220 preferably includes introducing a sputtering gas into chamber 300. Preferably, however the flow rate of sputtering gas into chamber 300 was preferably already increased production levels during increasing the pressure level 160. If it wasn't though, it may be subsequently increased. An appropriate quantity and type of power may then be applied to the target for sputtering of metal atoms from the target onto microelectronic topography 200. Chamber 300 may have a second pressure level during deposition of second hot sputtered portion 220. In a preferred embodiment, the second pressure level is approximately equal to the collapsing pressure level, and more preferably the second pressure level is approximately equal to the first pressure level as well.

The hot sputtering process conditions are preferably maintained for significantly longer than the cold sputtering process conditions. In an embodiment, hot sputtering may be maintained for a total duration of about 180 seconds. Of the total hot sputtering time, the time for which second hot sputtered portion 220 is deposited is preferably greater than the time for which first hot sputtered portion 216 is deposited. In fact, the length of processing step 162 is preferably at least twice as great as the length of processing step 154. As mentioned above, in an embodiment hot sputter deposition of first hot sputtered portion 216 may be performed for about 40 seconds. If approximately 180 seconds of deposition is desired at the given processing conditions, then hot sputter deposition of second hot sputtered portion 220 may be performed for about 140 seconds. Hot sputter deposition of second hot sputtered portion 220 is preferably continued until second hot sputtered portion 220 obtains a desired thickness.

If, for example, the power to target 302 and the flow of sputtering gas into chamber 300 are not terminated between deposition of the first hot sputtered portion and the second hot sputtered portion, then there may be bulk metal layer deposition occurring during the reducing and reflowing steps. If so, deposition of the first hot sputtered portion of the bulk metal layer may be considered to continue until pressure within the chamber is elevated in processing step 160. Once that step begins, then deposition of second hot sputtered portion 220 may be considered to have begun. Preferably, at least a portion of the bulk metal layer, preferably first hot sputtered portion 216, is still capable of reflowing when deposition of second hot sputtered portion 220 begins.

Together, cold sputtered portion 214, first hot sputtered portion 216, and second hot sputtered portion 220 preferably constitute bulk metal layer 222 (as shown in FIG. 11). (The lines shown in the drawing between cold sputtered portion 214 and first hot sputtered portion 216, and between first hot sputtered portion 216 and second hot sputtered portion 220, are merely to illustrate the separation between cold sputtered portion 214, first hot sputtered portion 216, and second hot sputtered portion 220 as deposited. It is not intended to represent the final position of these portions, nor it is intended to illustrate any definite interface between the portions in any final product.) Second hot sputtered portion 220 of the bulk metal layer is preferably deposited such that at least after reflowing of the bulk metal layer has stopped, the upper surface of bulk metal layer 222 is preferably substantially planar.

Cold sputtered portion 214 of the bulk metal layer is preferably thicker than first hot sputtered portion 216 and second hot sputtered portion 220 together, and second hot sputtered portion 220 is preferably thicker than first hot sputtered portion 216. Furthermore, cold sputtered portion 214, first hot sputtered portion 216, and second hot sputtered portion 220 are each preferably significantly thicker than wetting layer 212 (more preferably, at least twice as thick).

Sputter depositing bulk metal layer 222 as described above preferably includes sputter depositing, within a single chamber, substantially the entirety of the bulk metal layer. That is, substantially the entirety of a bulk metal layer used to form a substantially contiguous metallization structure (e.g., an interconnect line and underlying plug in a dual-Damascene scheme) is preferably sputter deposited in a single chamber in a manner as described above. In an embodiment, the entirety of a bulk metal layer may include first cold sputtered and second hot sputtered portions of the bulk metal layer, as well as any capping layer deposited thereabove.

Sputter depositing of the bulk metal layer may potentially include a variety of sputtering processes in which the metal for the bulk metal layer is sputtered from a target, including, standard, collimated, and ion metal plasma. Preferably, however, sputter deposition is performed by applying DC power to a target to induce sputtering of the target, and without filtering or biasing the sputtered atoms. In addition, the bulk metal layer may be deposited by other methods, such as CVD or evaporation, so long as the these methods are capable of depositing metal such that voids may form therein and be subsequently collapsed by pressure elevation. The bulk metal layer is preferably primarily composed of aluminum. The bulk metal layer may also include materials intended to enhance the performance of the aluminum, such as copper and/or silicon. However, the present method is preferably not limited by a metallization material; for example, other metals such as tungsten or copper may also be used.

It should be understood that hot sputtering may not begin in a technical sense (i.e., the deposited metal is still not configured to substantially reflow) until a short while after the actual process conditions are changed from those of cold sputtering to those of hot sputtering. It should be appreciated that regardless of the processing conditions used, the technical accuracy labels of the labels "hot" or "cold" sputtering may determined by the behavior of a material, e.g., immediately after being deposited. As such, a portion of the material deposited during processing conditions that fall under the classification "hot sputtering" may actually be "cold" sputtered, and vice versa. Therefore, when referring to only the process conditions of deposition, the terms "hot sputtering" and "cold sputtering" are used merely for convenience.

In a preferred embodiment, a capping portion (not shown) of bulk metal layer 222 may then be deposited above the first and second portions of bulk metal layer 222. The capping portion is preferably used to obtain a desired overall thickness of deposited metal. The capping portion of bulk metal layer 222 may be deposited in a manner similar to cold sputtered portion 214. That is, the capping portion of bulk metal layer 22 may be cold sputter deposited using processing parameters similar to that used to deposit cold sputtered portion 214 of the bulk metal layer. Whether or not a capping layer is utilized, the final bulk metal layer may be planarized using, e.g., chemical mechanical polishing to obtain a desired level of planarity and/or thickness. After deposition of bulk metal layer 222, microelectronic topography 200 may undergo further processing. For example, additional layers levels of metallization structures may be formed, possibly using methods similar to those described above, and other processing steps may be taken as necessary or desired to form an integrated circuit.

Figure 12:
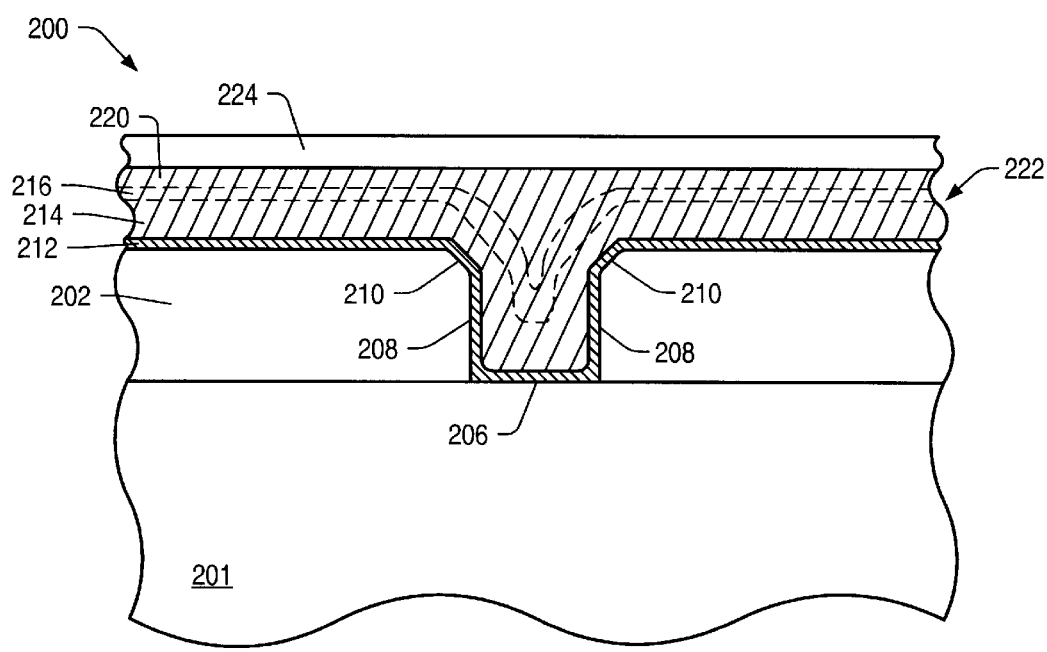
FIG. 12 is a partial cross-sectional view of the microelectronic topography, in which an insulating layer is formed above the bulk metal layer, according to a processing step subsequent to FIG. 11.

FIG. 12 presents a partial cross-sectional view of microelectronic topography in which an insulating layer is formed above bulk metal layer 222. Insulating layer 224 is preferably composed of a dielectric material, such a silicon dioxide. Insulating layer 224 may serve as a dielectric material for subsequent levels of metallization. Alternately, insulating layer 224 may serve as a passivation layer. Insulating layer 220 is preferably deposited upon the bulk metal layer 222. The capping metal layer (not shown) may be positioned between the second portion 216 of bulk metal layer 222 and insulating layer 224.

It will be appreciated by those skilled in the art having the benefit of this disclosure that this invention is believed to provide a method for fabricating a metallization structure in which a void is formed within a metal layer and subsequently collapsed, preferably allowing for improvement in the fill characteristics of metals deposited in narrow, high aspect ratio cavities. Further modifications and alternative embodiments of various aspects of the invention will be apparent to those skilled in the art in view of this description. For example, the process described herein is not limited to use in formation of integrated circuits, but may be used for a variety of products that may be apparent to those skilled in the art in view of this description. In addition, the wetting layer and the various portions of the bulk metal layer may be deposited using a variety of sputter deposition configurations not described above. Still further, the metallization structure may be fabricated in a damascene or non-damascene process. Still further, a pre-cleaning step does not have to be performed, and not performing such a step may actually aid in the formation of voids that can be subsequently collapsed. Still further, though the final metallization structure is preferably void-free; voids may nevertheless be present in some embodiments. Still further, the formation and subsequent collapse of a void or voids within a bulk metal layer as set forth herein may be repeated for as many times as desired. It is intended that the following claims be interpreted to embrace all such modifications and changes and, accordingly, the specification and drawings are to be regarded in an illustrative rather than a restrictive sense.

What is claimed is:

1. A method for fabricating a metallization structure, comprising:

setting a pressure level within a chamber to a metal deposition pressure level to deposit a metal layer;

after depositing the metal layer, decreasing the pressure level within the chamber to a void pressure level which is lower than the metal deposition pressure level to form a void having the void pressure level within the deposited metal layer; and subsequently increasing the void pressure level to a collapsing pressure level sufficiently above the void pressure level to collapse said void.

2. The method of claim 1, further comprising reflowing said deposited metal layer in the chamber at a reflow pressure level substantially equal to the void pressure level.

3. The method of claim 2, wherein a portion of the deposited metal layer is in a cavity in a dielectric layer, and wherein said reflowing is performed for a time sufficient to allow said void to form in the portion of the deposited metal layer in the cavity.

4. The method of claim 3, wherein after increasing said void pressure level, the portion of the deposited metal layer in the cavity is substantially void-free.

5. The method of claim 3, wherein the reflowing time is at least 5 seconds.

6. The method of claim 2, wherein the metal deposition pressure level is greater than said reflow pressure level.

7. The method of claim 6, wherein the collapsing pressure level is at least two orders of magnitude greater than the void pressure level.

8. The method of claim 1, wherein the collapsing pressure level is at least an order of magnitude greater than the void pressure level.

9. A method for fabricating a metallization structure, comprising:

depositing a first portion of a metal layer in a cavity in a dielectric layer in a deposition chamber having a pressure with a first value;

reducing the pressure in the deposition chamber to a second value significantly below the first value subsequent to said depositing the first portion of the metal layer;

reflowing the first portion of the metal layer during said reducing the pressure for a time sufficient to allow a void to form at least partially within the metal layer in the cavity;

increasing the pressure in the deposition chamber to a pressure having a third value significantly above the second value and sufficient to collapse the void subsequent to said reflowing; and depositing a second portion of the metal layer in the deposition chamber and above the first portion of the metal layer subsequent to said reflowing.

10. The method of claim 9, wherein said reducing the pressure in the deposition chamber comprises decreasing a first flow rate of a first gas into the deposition chamber, and said increasing the pressure in the deposition chamber comprises increasing a second flow rate of a second gas into the deposition chamber.

11. The method of claim 10, wherein said first flow rate is reduced to about zero.

12. The method of claim 9, wherein said reducing the pressure in the deposition chamber comprises terminating power to a target in the deposition chamber.

13. The method of claim 9, wherein the reflowing time is at least about 5 seconds, and wherein the third value is at least one order of magnitude greater than the second value.

14. The method of claim 13, wherein the reflowing time is about 15–60 seconds, and wherein the third value is at least two orders of magnitude greater than the second value.

15. The method of claim 9, wherein said first portion of the metal layer is deposited at a first temperature, said second portion of the metal layer is deposited at a second temperature, the second temperature is greater than the first temperature, and the metal layer comprises aluminum.

16. The method of claim 9, further comprising pre-cleaning prior to depositing the first portion of the metal layer.

17. The method of claim 16, wherein said pre-cleaning comprises removing an upper portion of the dielectric layer to form tapered upper portions of cavity sidewalls.

18. The method of claim 9, wherein depositing said first portion of the metal layer comprises depositing for a first deposition time, and depositing said second portion of the metal layer comprises depositing for a second deposition time greater than the first deposition time.

19. The method of claim 9, further comprising depositing a third portion of the metal layer in the cavity of the dielectric layer prior to said depositing the first portion of the metal layer.

20. The method of claim 9, wherein said first value is substantially equal to said third value.

* * * * *